United States Patent
Hashemi et al.

(10) Patent No.: US 10,957,738 B2
(45) Date of Patent: Mar. 23, 2021

(54) MAGNETIC RANDOM ACCESS MEMORY (MRAM) STRUCTURE WITH SMALL BOTTOM ELECTRODE

(71) Applicant: International Business Machines Corporation, Armonk, NY (US)

(72) Inventors: Pouya Hashemi, Purchase, NY (US); Bruce B. Doris, Slingerlands, NY (US); Chandrasekharan Kothandaraman, New York, NY (US); Nathan P. Marchack, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/374,120

(22) Filed: Apr. 3, 2019

(65) Prior Publication Data
US 2020/0321394 A1    Oct. 8, 2020

(51) Int. Cl.
*H01L 23/528* (2006.01)
*H01L 27/22* (2006.01)
*H01L 43/12* (2006.01)
*H01L 43/02* (2006.01)
*H01L 43/08* (2006.01)

(52) U.S. Cl.
CPC ............ *H01L 27/224* (2013.01); *H01L 43/12* (2013.01); *H01L 43/02* (2013.01); *H01L 43/08* (2013.01)

(58) Field of Classification Search
CPC .......................... G11C 11/1659; H01L 23/528
See application file for complete search history.

(56) References Cited

U.S. PATENT DOCUMENTS

| | | | |
|---|---|---|---|
| 7,936,027 B2 | 5/2011 | Xiao et al. | |
| 8,334,213 B2 | 12/2012 | Mao | |
| 2009/0173977 A1 | 7/2009 | Xiao et al. | |
| 2010/0311243 A1 | 12/2010 | Mao | |
| 2011/0049655 A1* | 3/2011 | Assefa | H01L 27/222 257/421 |
| 2017/0229641 A1 | 8/2017 | Annunziata et al. | |
| 2018/0366517 A1* | 12/2018 | Lin | H01L 43/02 |

OTHER PUBLICATIONS

Joubert et al., "An Etching Method", An IP.com Prior Art Database Technical Disclosure, IP.com No. IPCOM000199693D, Sep. 15, 2010, 26 pages.

* cited by examiner

*Primary Examiner* — Thomas L Dickey
(74) *Attorney, Agent, or Firm* — Scully, Scott, Murphy & Presser, P.C.; Daniel Morris, Esq.

(57) ABSTRACT

A semiconductor structure and fabrication method of forming a semiconductor structure. The structure is a MRAM element having a first conductive electrode embedded in a first interconnect dielectric material layer upon which a multi-layered magnetic tunnel junction (MTJ) memory element is formed in a magnetoresistive random access memory (MRAM) device area. The first conductive electrode includes a first end having a top surface of a first surface area and a second end having a bottom surface of a second surface area, the first surface area being smaller than the second surface area. The second end of the bottom electrode includes a barrier liner material including a metal fill material, and the first end of the bottom electrode is a pillar structure formed as a result of an etchback process in which the metal barrier liner is recessed relative to the metal fill material.

9 Claims, 10 Drawing Sheets

MAGNETIC RANDOM ACCESS MEMORY (MRAM) STRUCTURE WITH SMALL BOTTOM ELECTRODE

FIELD

The present invention relates to MRAM structures generally, and more particularly, methods of manufacturing an MRAM structure made on a BEL (bottom electrode) with small top surface to avoid partial short and larger bottom surface to avoid excessive resistance increase.

BACKGROUND

MRAM is a non-volatile random access memory technology in which data is stored by magnetic storage elements. These elements are typically formed from two ferromagnetic layers, each of which can hold a magnetization, separated by a thin dielectric layer. One of the two layers is a permanent magnet set to a particular polarity; the other layer's magnetization can be changed to match that of an external field to store memory. Such a configuration is known as magnetic tunnel junction (MTJ).

In leading-edge or neuromorphic computing systems, a MTJ structure (or pillar) is typically embedded within a back-end-of-the-line (BEOL) structure, a metal hard mask is typically formed above a multilayered MTJ structure, and the metal hardmask is used as an etch mask to provide the MTJ structure.

Current semiconductor manufacturing techniques of an MTJ bit, i.e., a MTJ stack, requires patterning of the fixed layer, free layer, and tunnel layer. However, current processing techniques for patterning of MTJ stacks encounter issues with redeposition, as the stack is often etched using physical sputtering.

Moreover, as MRAM is a viable memory option for stand alone and embedded applications for Internet-of-Things (IoT), Automobile, AI, etc., the size of the bottom electrode (BEL) plays a significant role on array yield loss due to partial metallic shorts, especially when the MTJ size is reduced to increase switching efficiency. A very small BEL is desired but resistance and metal fill are concerns related to this requirement.

SUMMARY

A sub-lithographic bottom electrode (BEL) connection to an underlying metal layer for an MTJ of an MRAM device and a method of forming.

The sub-lithographic bottom electrode (BEL) connection structure includes a small top surface to avoid partial short and larger bottom surface to avoid excessive resistance increase.

A fabrication method to produce such an MRAM structure including an MTJ pillar formed on the sub-lithographic BEL with small top surface.

In a first aspect of the invention, there is provided: a semiconductor structure. The semiconductor structure comprises: a metal wiring layer embedded in a first interconnect dielectric material layer and located in a magnetoresistive random access memory (MRAM) device area. A second interconnect dielectric material layer is located above the first interconnect dielectric material layer and a multi-layered magnetic tunnel junction (MTJ) structure is disposed on the second interconnection dielectric material layer, the MTJ structure having a top ferromagnetic layer and a bottom ferromagnetic layer, the bottom ferromagnetic layer having a surface in electrical contact with said embedded metal wiring layer, wherein the embedded metal wiring layer comprises a first end having first surface area of sub-lithographic dimension contacting the bottom ferromagnetic layer surface, and a second end having a bottom surface of a second surface area, the first surface area being smaller than the second surface area.

In a second aspect of the invention, there is provided: a method of forming a semiconductor structure. The method comprises: forming and patterning a mask in a mask layer formed above a first interlevel dielectric material layer of an MRAM device; etching, using the mask, an opening in the first interlevel dielectric material layer, the opening exposing a top surface of a first interlevel contact; depositing on sidewalls of the opening and on the exposed contact surface of the first interconnect contact, a conductive barrier liner material; depositing in a remaining space within the opening, a metal fill material; planarizing to render coplanar a top surface of the metal fill, a top surface of the conductive barrier liner and a top surface of the first interlevel dielectric material layer; recessing the conductive barrier liner for a predetermined depth within the opening and selective to the material metal fill material; deposit in the recess a further interlevel dielectric material. The resulting structure is then planarized to render coplanar the top surface of the metal fill material, a top surface of the further interlevel dielectric material and the top surface of the first interlevel dielectric material layer. The method further comprises: forming a multi-layered magnetic tunnel junction (MTJ) structure disposed on the second interconnection dielectric material layer, the MTJ structure having a top ferromagnetic layer and a bottom ferromagnetic layer, the bottom ferromagnetic layer having a surface in electrical contact with the exposed top surface of the metal fill.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Figure 1:
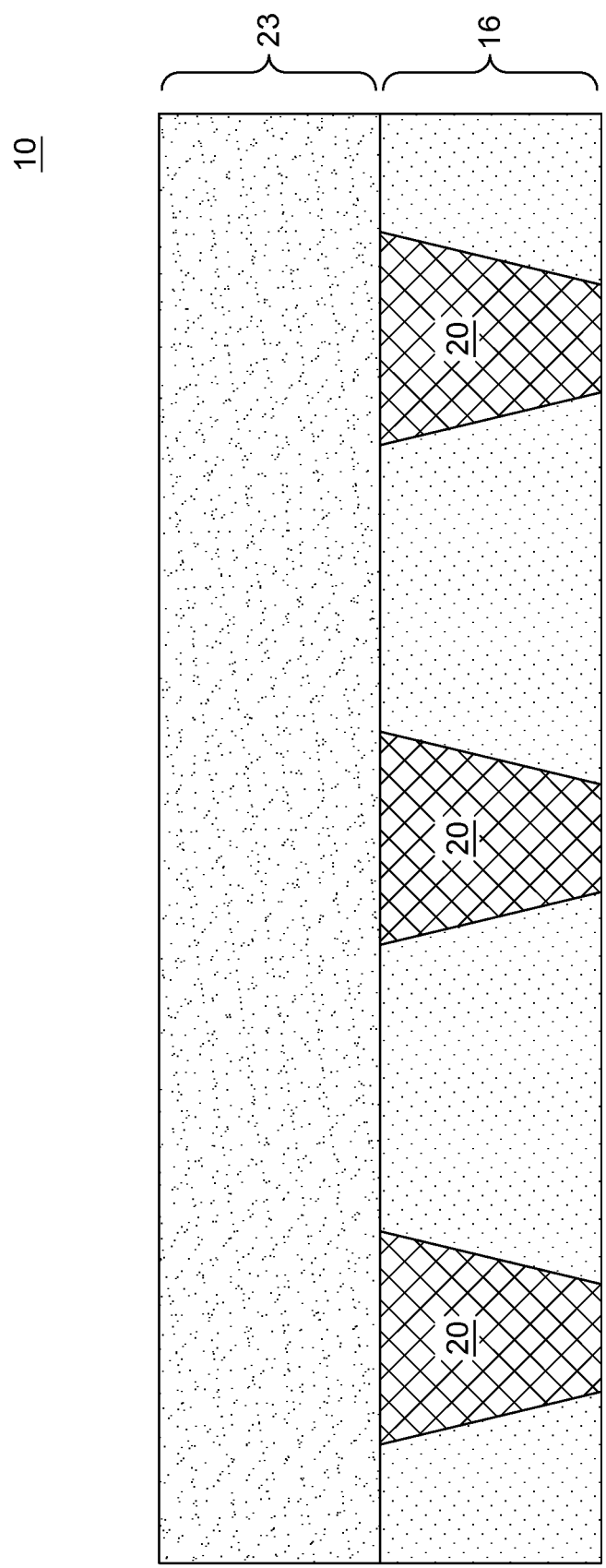
FIG. 1 is a cross sectional view of an exemplary structure of the present application during an early stage of fabrication.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Magnetoresistive random access memory (MRAM) is a non-volatile memory that combines a magnetic device with standard silicon-based microelectronics to obtain the combined attributes of non-volatility, high-speed read/write operations, high read/write endurance and data retention. Data is stored in MRAM as magnetic states or characteristics (e.g., polarity or magnetic moment) instead of electric charges. In a typical configuration, each MRAM cell includes a magnetic tunnel junction (MTJ) structure (i.e., pillar) for data storage, a bit line and a word line. In general, the MTJ's electrical resistance will be high or low based on the relative magnetic states of certain layers within the MTJ structure. Data is written to the MTJ structure by applying certain magnetic fields or charge currents to switch the magnetic states of the layers of the MTJ structure. Data is read by detecting the resistance of the MTJ structure. Using a magnetic state/characteristic for storage has two main benefits. First, unlike electric charge, magnetic state does not leak away with time, so the stored data remains even when system power is turned off. Second, switching magnetic states has no known wear-out mechanism. The term "magnetoresistance" describes the effect whereby a change to certain magnetic states of the MTJ structure results in a change to the MTJ resistance, hence the name "Magnetoresistive" RAM.

Referring first to FIG. 1, there is illustrated a cross sectional view of a first exemplary initial structure upon which is formed a sub-lithographic bottom electrode of the present invention. Such sub-lithographic bottom electrode can be formed by processes during Middle-Of-Line (MOL) or during a Back-End-Of-Line (BEOL) stage of semiconductor MRAM device fabrication. FIG. 1 particularly shows an interconnect level 10 including a plurality of first metal structures 20 embedded in a first interconnect dielectric material layer 16. These metal structures 20 can be copper interconnects formed as trenches in the interconnect dielectric material layer that contact underlying conductive structures. Although not shown, a first diffusion barrier liner may be typically present between each first electrically conductive structure 20 and the first interconnect dielectric material layer 16. In some embodiments and as depicted in FIG. 1, this interconnect level 10 can be positioned above a middle-of-the line (MOL) level that includes a MOL dielectric material layer having further contact structures embedded therein for contacting metal structures 20.

In an embodiment, the dielectric material layer 16 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide.

In one embodiment, the MOL dielectric material layer 16 can be formed utilizing a deposition process including, for example, chemical vapor deposition (CVD), plasma enhanced chemical vapor deposition (PECVD), evaporation or spin-on coating.

The contact metal structures 20 are formed as follows: Contact openings (not shown) are first formed into the MOL dielectric material layer 16 utilizing lithography and etching. The contact openings are then filled with a contact metal or metal alloy such as, copper, tungsten (W), cobalt (Co), platinum (Pt), nickel (Ni) or alloys thereof. The opening may be first lined with a conductive barrier material. The filling of the contact openings may include a deposition process such as, for example, chemical vapor deposition (CVD), plasma enhanced chemical vapor deposition (PECVD), atomic layer deposition (ALD), physical vapor deposition (PVD), sputtering, chemical solution deposition or plating. A planarization process may follow the filling of the contact openings.

As shown in FIG. 1, a further interconnect dielectric material layer 23 is deposited in which the sub-lithographic bottom electrode for an MTJ device is formed that electrically connects the underlying contact structure 20. Interconnect dielectric material layer 23 that is deposited over the surface of interconnect layer 16 can include an inorganic dielectric material or an organic dielectric material. In one embodiment, the interconnect dielectric material layer 23 can be non-porous. In another embodiment, the interconnect dielectric material layer 23 may be porous. Some examples of suitable dielectric materials (i.e., interconnect dielectrics) that may be used as the further interconnect dielectric material layer 23 include, but are not limited to, low-k dielectrics, e.g., silicon dioxide, silicon nitride, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The interconnect dielectric material layer 23 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the interconnect dielectric material layer 23 may vary depending upon the type of dielectric material(s) used. In one example, the interconnect dielectric material layer 23 may have a thickness from 100 nm to 250 nm, however, other thicknesses that are lesser than, or greater than, the aforementioned thickness range may also be employed in the present application for the thickness of the further interconnect dielectric material layer 23. The interconnect dielectric material layer 23 may be formed utilizing any deposition process including, but not limited to, CVD, PECVD or spin-on coating.

Figure 2:
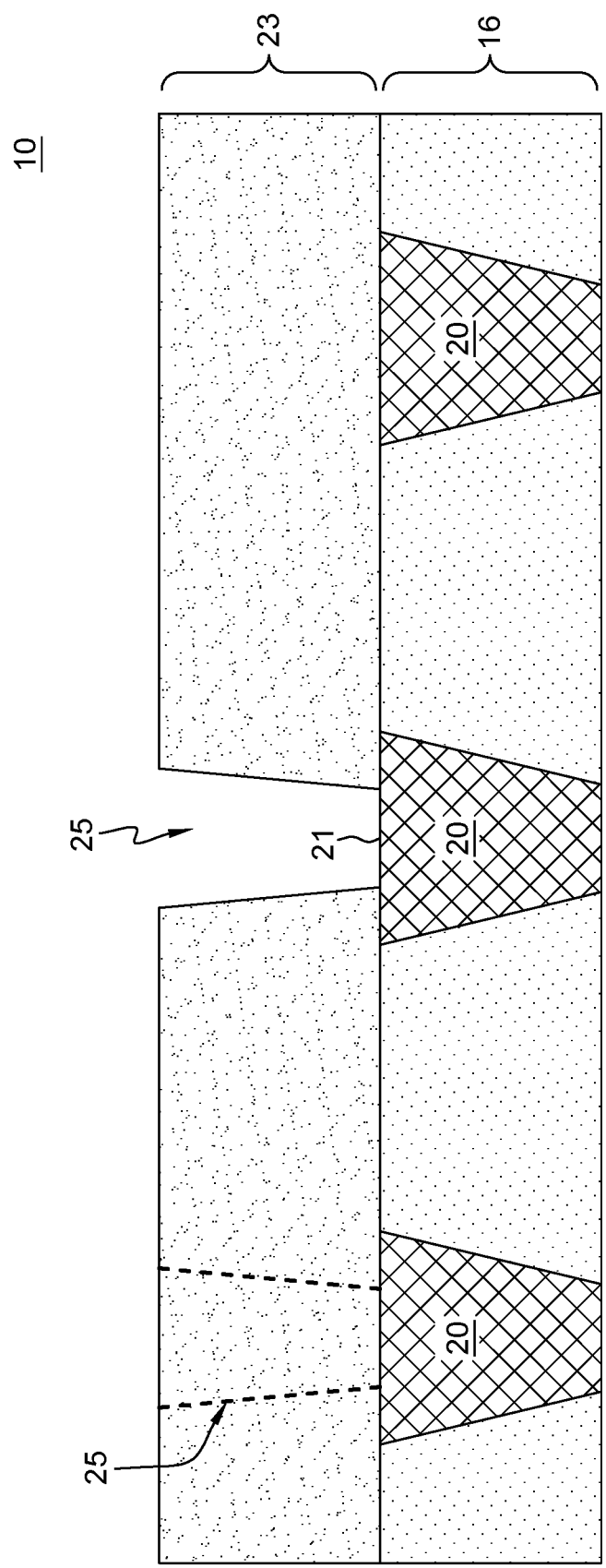
FIG. 2 is a cross sectional view of the exemplary structure of FIG. 1 after etching openings in a dielectric layer of the structure shown in FIG. 1.

Forming of the sub-lithographic bottom electrode for the MTJ device that electrically connects an MTJ cell terminal to an underlying contact structure 20 is shown in FIGS. 2-10. Referring to FIG. 2, the further interconnect dielectric material layer 23 is processed (i.e., etched) to form a plurality of vias or openings 25 at locations that correspond to an magnetoresistive memory element to be formed in an MRAM device area. For purposes of illustration of the methods herein, a single via opening 25 is shown formed in the interconnect dielectric material layer 23. In the embodiment depicted in FIG. 2, the etched via openings 25 extend entirely through the first interconnect dielectric material layer 23 to expose a top surface 21 of the underlying metal contact 20. The openings 25 may be via openings, line openings or combined via/line openings formed by lithography and etching, e.g., reactive ion etching (RIE). These openings 25 are used to form the sub-lithographic bottom electrode corresponding to an individual MRAM MTJ cell. In an embodiment, the formed opening 25 may be of a diameter ranging between 30 nm-60 nm however, other thicknesses/diameters of opening 25 can be used.

Figure 3:
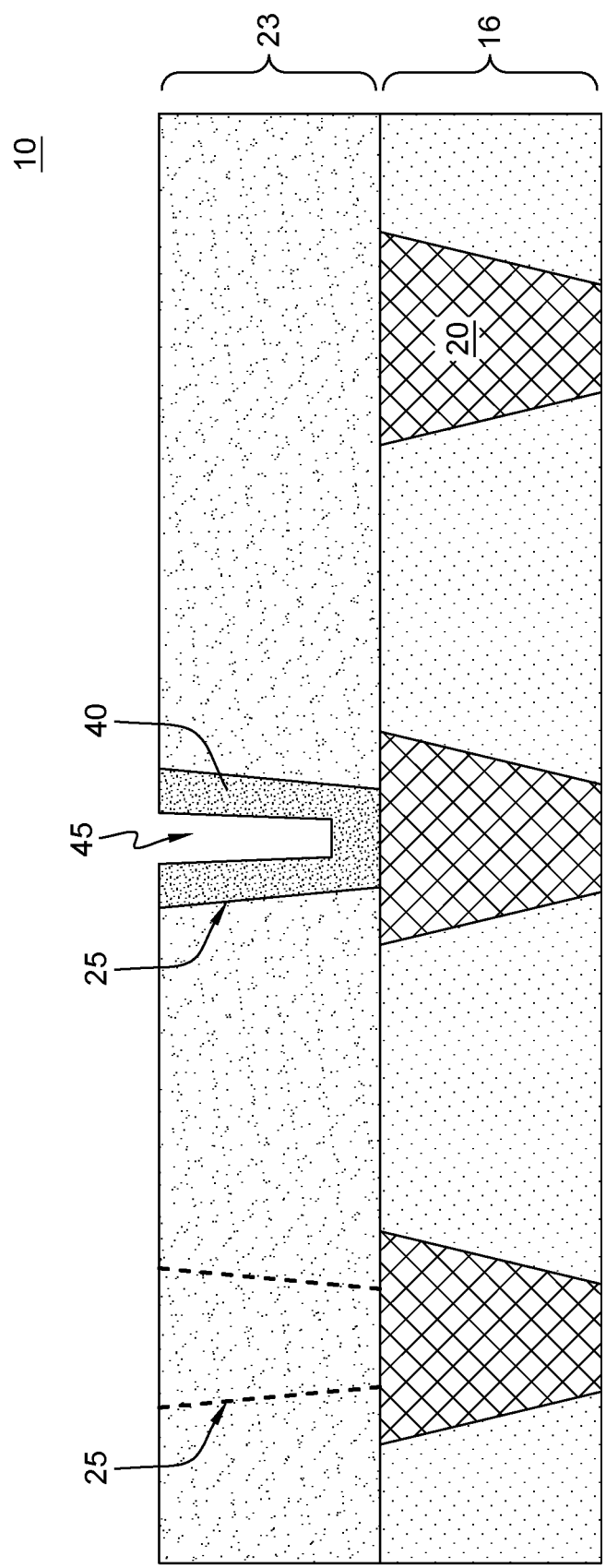
FIG. 3 is a cross sectional view of the exemplary structure of FIG. 2 after depositing a conductive metal liner within each etched opening in the dielectric layer.

Referring to FIG. 3, there is depicted a resulting structure shown after a deposition of a metal liner material 40 into the formed opening 25. In particular, a diffusion barrier material liner 40 is formed into each opening 25 including bottom and sidewall surfaces and on the topmost surface of the interconnect dielectric material layer 23. The diffusion barrier material layer includes a diffusion barrier material (i.e., a material that serves as a barrier to prevent a conductive material such as copper from diffusing there through) such as, for example, Co, Ta, TaN, Ti, TiN, Ru, RuN, RuTa, RuTaN, W, or WN. In some embodiments, the diffusion barrier material layer may include a material stack of diffusion barrier materials. In one example, the diffusion barrier material layer may be composed of a stack of Ta/TaN. The thickness of the diffusion barrier material layer may vary depending on the deposition process used as well as the material employed. In some embodiments, the diffusion barrier material layer may have a thickness from 10 nm to 25 nm, although other thicknesses for the diffusion barrier material layer can be employed in the present application. After material liner deposition, there remains an empty volume of space 45 in opening 25 having a diameter ranging from about 15 nm-40 nm. The diffusion barrier material layer 40 can be formed by a deposition process including, for example, CVD, PECVD, ALD, physical vapor deposition (PVD), sputtering, chemical solution deposition or plating.

Figure 4:
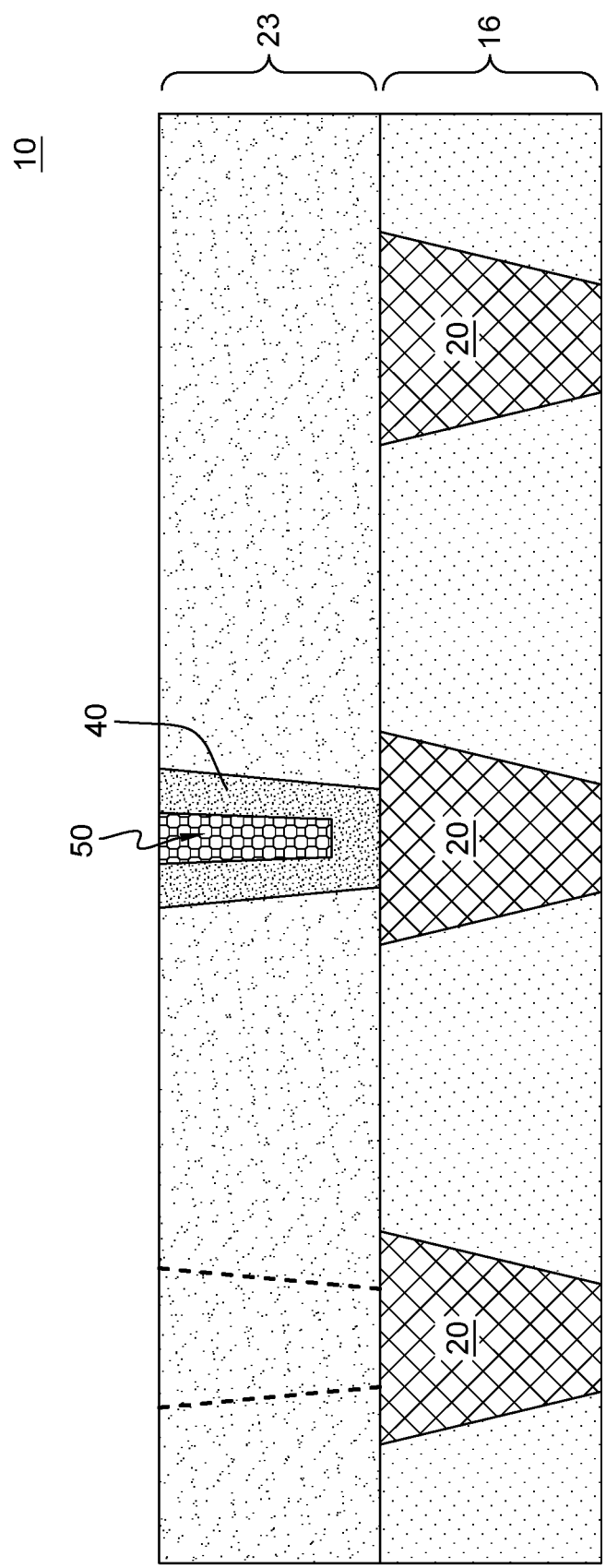
FIG. 4 is a cross sectional view of the exemplary structure of FIG. 3 after depositing a conductive metal fill material within each lined opening.

As shown in FIG. 4, an electrically conductive metal fill material or metal alloy fill material 50 is then deposited into each opening 45 and, is encapsulated on its bottom and sidewall surfaces by the diffusion barrier metal liner layer 40. Examples of electrically conductive metal fill 50 that may be used in the present application include copper (Cu), aluminum (Al), tungsten (W), titanium (Ti), tantalum (Ta), TiN, TaN or ruthenium (Ru), while an example of an electrically conductive metal alloy is a Cu—Al alloy. The fill metal is selected to not be identical to the metal liner. The electrically conductive metal or metal alloy can be formed utilizing a deposition process such as, for example, CVD, PECVD, sputtering, chemical solution deposition or plating. In one embodiment, a bottom-up plating process is employed in forming the electrically conductive metal or metal alloy fill 50.

As further shown in FIG. 4, after depositing the metal liner (Ml) 45 and fill metal (Mf) 50, the surface of the resulting structure can be subject to a planarization. That is, following the deposition of the electrically conductive metal or metal alloy fill 50, a planarization process such as, for example, chemical mechanical polishing (CMP) and/or grinding, can be used to remove the electrically conductive metal or metal alloy (i.e., overburden material) and the diffusion barrier material layer that is present outside each of the openings and from the topmost surface of the interconnect dielectric material layer 23.

Figure 5:
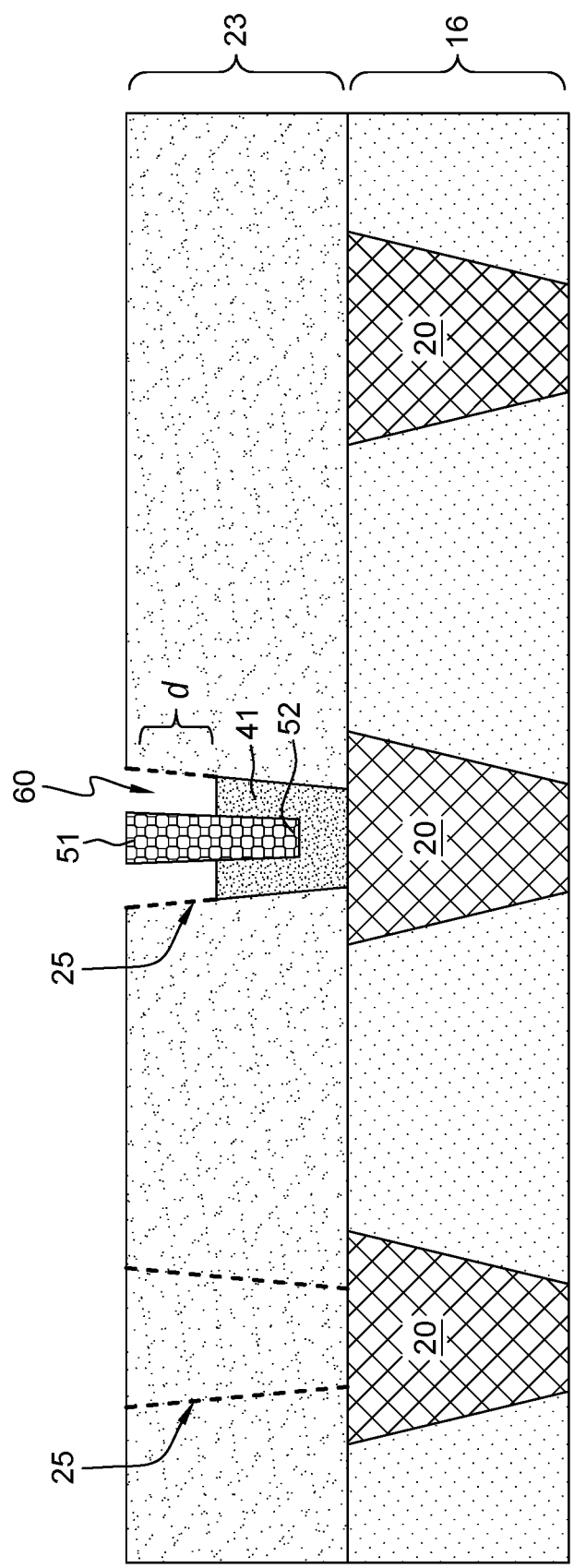
FIG. 5 is a cross sectional view of the exemplary structure of FIG. 4 after etching back the metal liner within each etched opening in the dielectric layer.

FIG. 5 shows a resulting structure after a step of selectively recessing Ml layer 40 with respect to the Mf layer 50 as shown in FIG. 4. In an embodiment, the selective etch 60 may be performed (e.g., using RIE or WETs or combinations thereof) or a plasma etch, in order to remove the metal liner portion while leaving a protruding pillar-shaped metal fill structure 51. That is, the etch chemistry used is selective to the metal fill material 50 and the dielectric material 23. As shown in FIG. 5, the intermediate structure shows a resulting sub-lithographic size bottom metal contact electrode 50 for an MTJ element to be formed. In an embodiment, the bottom metal contact electrode portion 51 is cylindrical in structure and having a diameter ranging from about 15 nm-40 nm, although lesser and greater diameters are contemplated. In an embodiment, the metal liner material 40 is etched back for a distance "d" relative to the depth of via opening 25. d in this case can be in the range of 0.25 to 0.75 the total depth of the via opening, e.g., with a via depth of 100 nm, d=25 nm-75 nm. As a result of the etch back of metal liner 40, there remains an anchor electrode portion of larger diameter that includes an opposite end portion 52 of the sub-lithographic size Mf material structure and the remaining surrounding Ml barrier material 41. In an embodiment, the etch will be calibrated so to ensure there remains a bottom portion 41 of the electrode to maintain the integrity of the protruding Mf structure 51.

Figure 6:
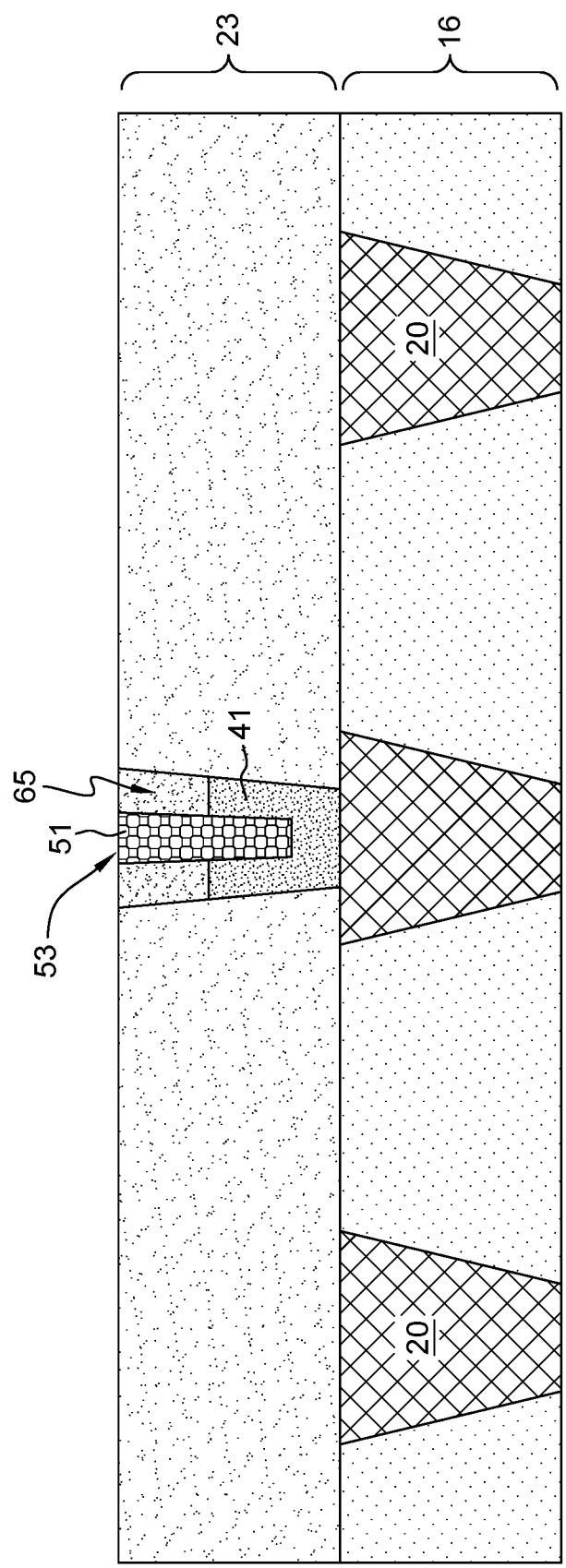
FIG. 6 is a cross sectional view of the exemplary structure of FIG. 5 after a deposition of a dielectric fill in the etched back opening and after planarizing the surface.

FIG. 6 shows a result of filling the selective etched recess 60 with a BEOL dielectric material 65 and then performing a further CMP planarization technique to planarize the surface of layer 23. In an embodiment, the further interconnect dielectric material 65 is of the same composition as dielectric layer 23. The deposited dielectric material 65 may include a low-k dielectric, e.g., an inorganic dielectric material or an organic dielectric material and may be porous or non-porous. Some examples of suitable dielectric materials (i.e., interconnect dielectrics) that may be used as the further interconnect dielectric material 65 include, but are not limited to, silicon dioxide, silsesquioxanes, C doped oxides (i.e., organosilicates) that includes atoms of Si, C, 0 and H, thermosetting polyarylene ethers, or multilayers thereof.

As a result of the planarizing, as shown in FIG. 6, each electrically conductive bottom metal contact electrode 51 has a topmost surface 53 that is coplanar with a topmost surface of the interconnect dielectric material layer 23.

Figure 7:
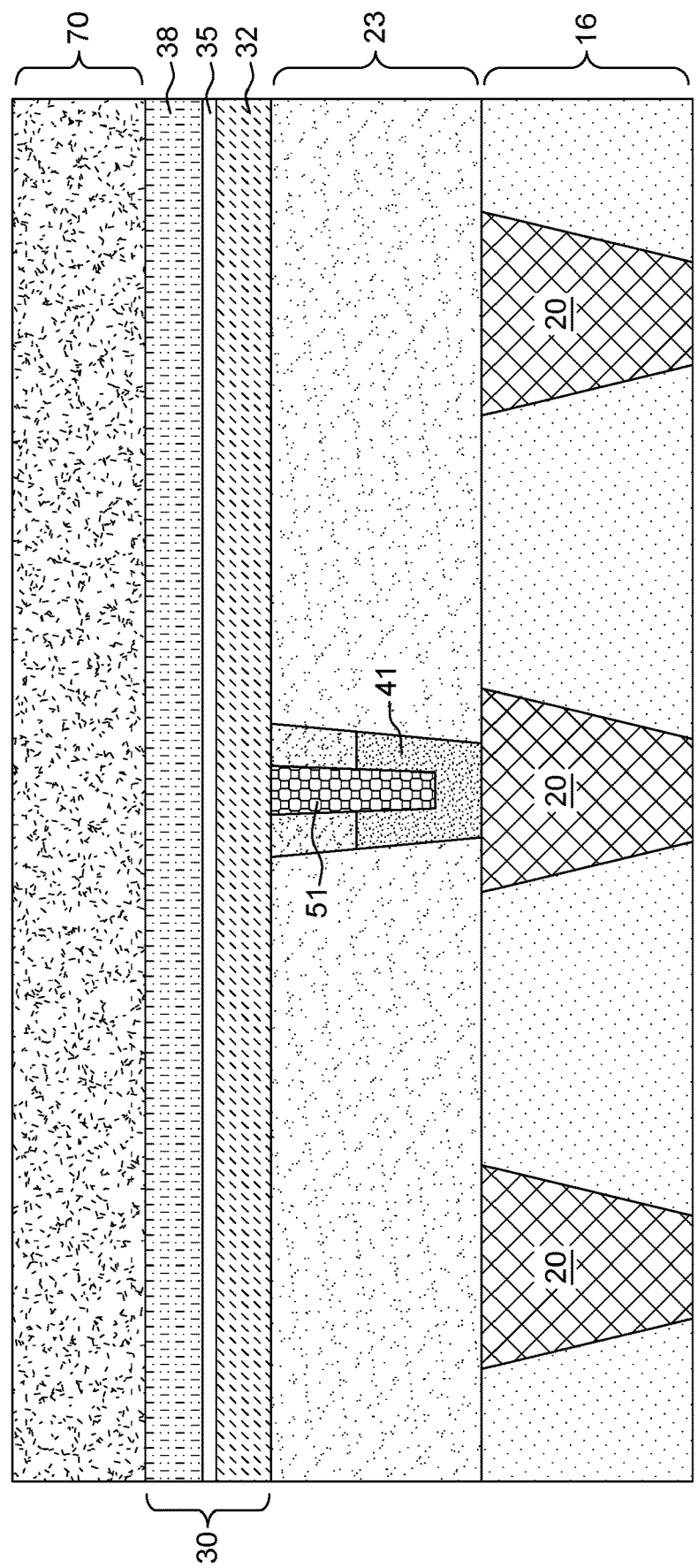
FIG. 7 is a cross sectional view of the exemplary structure of FIG. 6 after a deposition of materials forming the MTJ structure and a top electrode that doubly functions as a hardmask.

Continuing to FIG. 7, a multilayered MTJ structure 30 is formed above the interconnect level dielectric 23. The multilayered MTJ structure 30 can be formed by conventional processes, e.g., utilizing one or more deposition processes such as, for example, CVD, PECVD, PVD, or sputtering. The multilayered MTJ structure 30 may include a stack, from bottom to top, of a reference layer 32, a tunnel barrier 35, and a free layer 38. It is understood that these layers in the stack may be reversed having, from bottom to top, the free layer, the tunnel barrier, and reference layer. In either orientation, the MTJ stack 30 may range from anywhere between 20 nm-40 nm thick although greater or lesser thicknesses is contemplated.

In the embodiment of FIG. 7, the reference layer 32 has a fixed magnetization, i.e., is "pinned". The pinned reference layer 32 of the multilayered MTJ structure 30 may be composed of a metal or metal alloy that includes one or more metals exhibiting high spin polarization. In alternative embodiments, exemplary metals for the formation of the reference layer include iron, nickel, cobalt, chromium, boron, or manganese. Exemplary metal alloys may include the metals exemplified by the above. In another embodiment, the reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier 35 of the multilayered MTJ structure 30 is composed of an insulator material and is formed at such a thickness as to provide an appropriate tunneling resistance. Exemplary materials for the tunnel barrier include magnesium oxide (MgO), aluminum oxide ($Al_2O_3$), and titanium oxide, or materials of higher electrical tunnel conductance, such as semiconductors or low-bandgap insulators.

The free layer 38 of the multilayered MTJ structure 30 is composed of a magnetic material with a magnetization that can be changed in orientation relative to the magnetization orientation of the reference layer. Exemplary materials for the free layer of the MTJ structure include alloys and/or multilayers of cobalt, iron, alloys of cobalt-iron, nickel, alloys of nickel-iron, and alloys of cobalt-iron-boron.

After providing the multilayered MTJ structure 25, an MTJ cap layer (not shown) can be formed on the multilayered MTJ structure 30. Such an MTJ cap layer may be composed of Ru, Pd, Pt, Rh, Sc, or other high melting point metals or conductive metal nitrides, however the cap layer is meant to serve as an etch stop for the hard mask patterning process and should thus be resistant to the chemistry used to pattern a metal electrode layer formed directly over it. The MTJ cap layer can be formed utilizing a deposition process including, for example, CVD, PECVD, ALD, PVD, sputtering, chemical solution deposition or plating and may have a thickness ranging from between 2 nm to 25 nm; other thicknesses are possible and can be used in the present application as the thickness of the MTJ cap layer.

As shown in FIG. 7, after providing the MTJ cap layer, an upper metal hardmask (HM) layer 70 is conventionally formed over the MTJ cap using known damascene semiconductor manufacturing processing. The MTJ hardmask can be formed utilizing a deposition process including, for example, PEALD, PECVD, PVD, sputtering, chemical solution deposition or plating, as long as the thermal budget does not exceed that of the MTJ stack. Exemplary materials for the hardmask layer typically include "high-sticking" coefficient conductive material such as W, WN, Nb, NbN, Ta, TaN, Ti, TiN, Al or other high melting point metals or conductive metal nitrides. The upper hardmask layer may have a thickness from 50 nm to 100 nm; other thicknesses are possible and can be used in the present application as the thickness of the upper hardmask layer.

Figure 8:
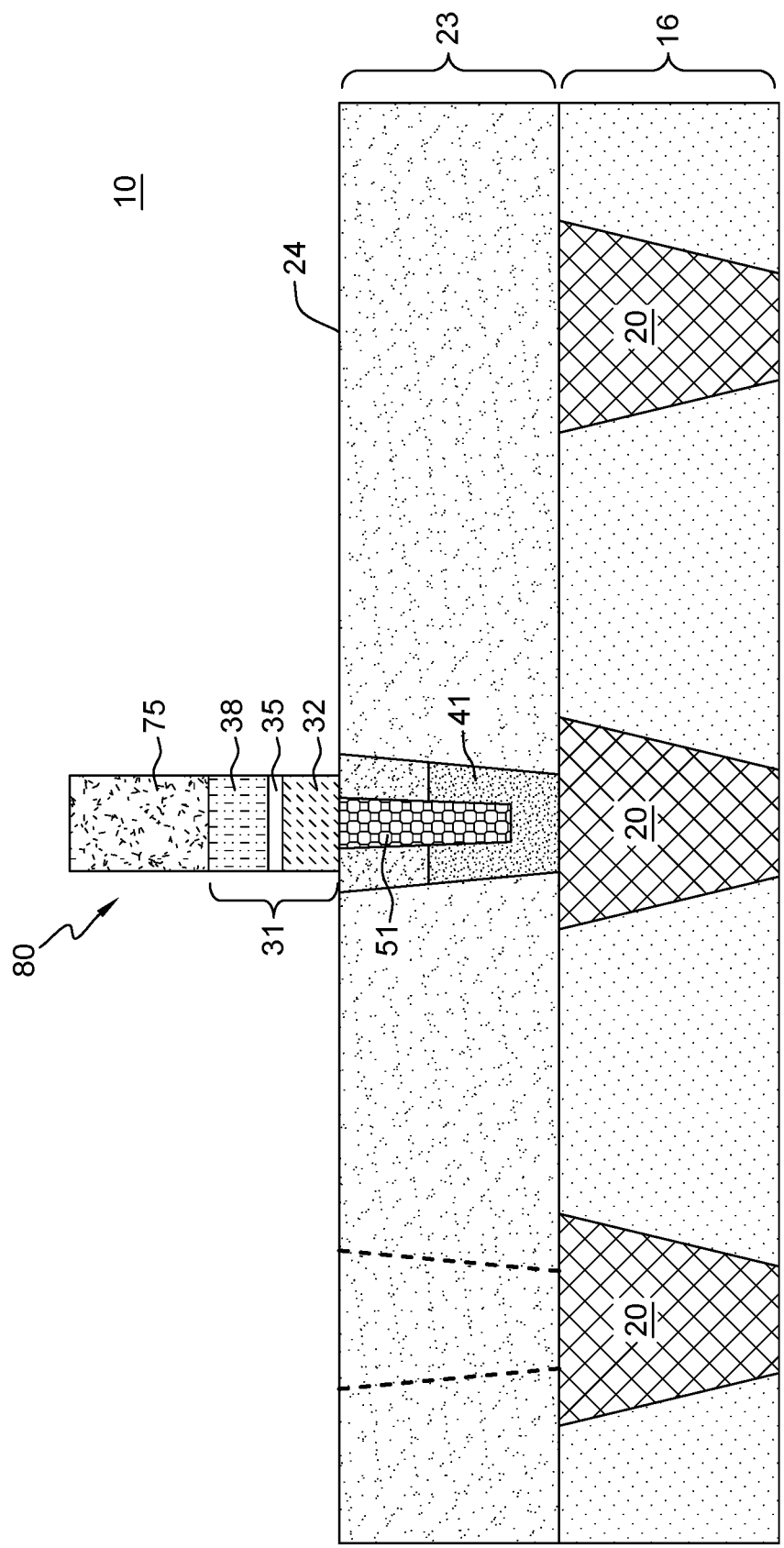
FIG. 8 is a cross sectional view of the exemplary structure of FIG. 7 after patterning and sputter etching of the MTJ layer stack to form an MTJ pillar structure with top hardmask conductive electrode.

FIG. 8 shows a resulting MRAM bit structure 80 after patterning and etching to form a top conducting electrode 75 and an underlying MTJ pillar 31. In particular, FIG. 8 depicts an intermediate structure after performing conventional lithographic patterning and plasma etching or RIE of the metal hardmask layer 70 of FIG. 7 to form a conductive structure 75 that doubly functions as a hardmask structure and as a top electrode 75 for the MRAM pillar. In an embodiment, a lithographic mask layer (e.g., organic planarization layer (OPL) not shown) can be deposited over the blanket metal HM film 70 of FIG. 7. A pillar shape is obtained using patterning of the lithographic mask to form a pillar mask, e.g., a negative image of a hole mask (not shown) which is used to define the MTJ stack. This may be followed by a halogen-based etch of the masked hardmask layer 70 (e.g. using $Cl_2$, $CHF_3$, or some combination thereof) to transfer this pillar/cylinder through the HM layer 70. In the embodiment shown in FIG. 8, the diameter of the resulting top electrode pillar structure 75 ranges anywhere from between 35 nm-80 nm. The hardmask layer etch lands on an etch stop layer which is described as the MTJ cap (not shown). Ru material serves as a good stop layer for Cl/F chemistries and protects the MTJ layer from damage due to diffusion of those reactants.

Then, the wafer upon which the MRAM is formed is subjected to a downstream plasma ($H_2O/N_2$) to passivate remnant surface Cl. The remaining OPL is then stripped using an $O_2$ plasma, followed by DI Water Rinse for preventing Cl residual corrosion.

In accordance with conventional manufacturing techniques, to form the MRAM bit 80 shown in FIG. 8, after forming hardmask/top electrode pillar structure 75, the MTJ stack layer 30 is then mechanically etched, e.g., via ion beam etching or sputtering, to remove portions of the stack MTJ stack layer 30 not aligned with (covered by) the hardmask/top electrode 75 which serves as a combined etch mask. FIG. 8 shows the result of the mechanical sputtering in which the final MTJ pillar structure 31 results in the final MRAM bit structure 80. In the embodiment shown in FIG. 8, as a result of the sputtering, the diameter of the resulting MRAM bit structure 80 ranges anywhere from between 35 nm-80 nm.

As is shown in FIG. 8, the multilayered hardmask structure 75 has outermost sidewalls that are vertically aligned to the outermost sidewalls of the MTJ cap (not shown) and the underlying MTJ structure 31. As is further shown, this pillar of the multilayered hardmask structure 75, optional MTJ cap and MTJ structure 31 is in electrical contact with top surface 53 of the small bottom electrode portion 51 that is present in the MRAM device area of the exemplary structure. In an embodiment, the pillar of the multilayered hardmask structure, the MTJ cap and MTJ structure 31, when looking from a top down view, is circular in shape.

Figure 9:
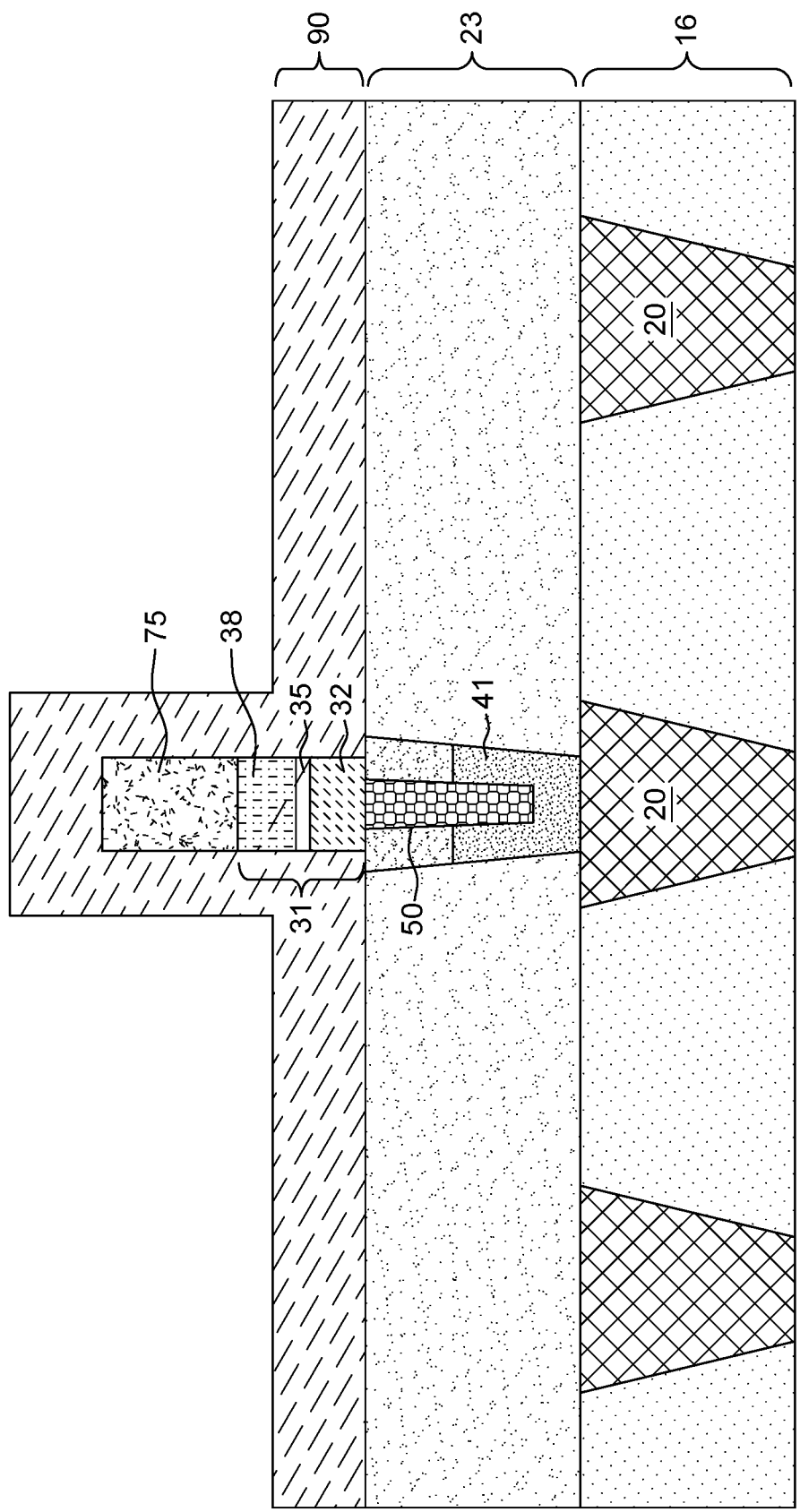
FIG. 9 depicts a cross-sectional view of the resulting structure of the MRAM pillar of FIG. 8 having formed thereon an encapsulating MTJ passivation layer.
Figure 10:
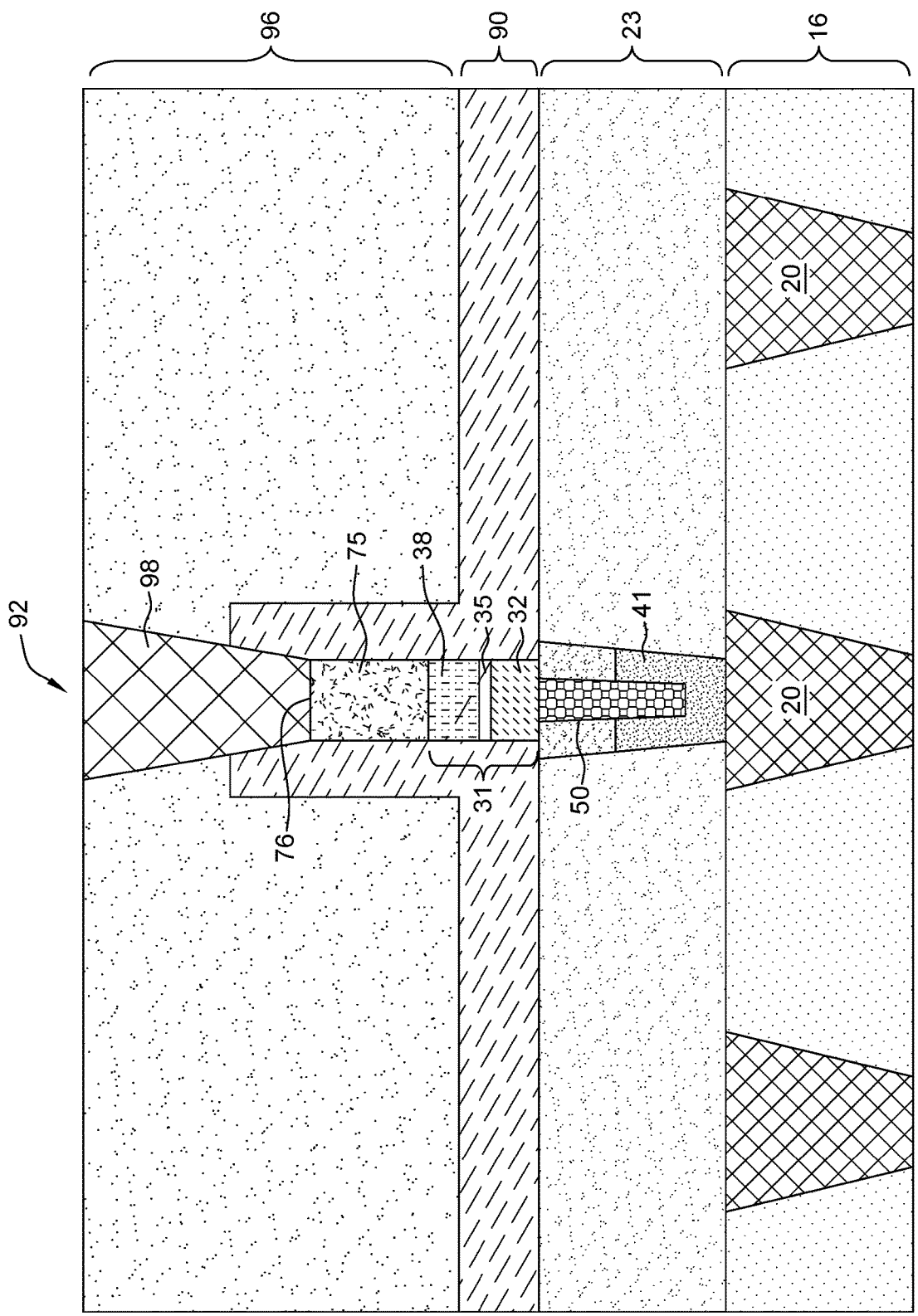
FIG. 10 depicts a cross-sectional view of a resulting upper conductive contact structure formed in an upper interconnect dielectric material layer formed above the MTJ passivation layer and contacting the top hardmask conductive electrode.

Referring now to FIGS. 9 and 10, there is illustrated the exemplary structure of FIG. 8 after forming an upper interconnect level including a further electrically conductive structure 95 contacting the patterned upper electrode/hard mask layer 75.

In particular, as shown in FIG. 9, an MTJ passivation layer 90 such as a metal oxide or metal nitride or like dielectric material is deposited to encapsulate the resulting structure shown in FIG. 8. In an embodiment, passivation layer 90 is formed on top the planar surface 24 of the interlevel dielectric 23 and conformally on the top electrode and side surfaces of the underlying MRAM stack structure 80 of FIG. 8. In an embodiment, the thickness of the dielectric MTJ passivation layer 90 may range from 20 nm-40 nm although greater and lesser thicknesses can be used.

As shown in FIG. 10, an upper interconnect level can be formed by first providing a second interconnect dielectric material layer 96 above the MTJ passivation layer 90. The second interconnect dielectric material layer 96 may include one of the interconnect dielectric materials mentioned above for the first interconnect dielectric material layer 16. In one embodiment, the second interconnect dielectric material layer 96 is composed of a same interconnect dielectric material as the first interconnect dielectric material layer 16. In other embodiment, the second interconnect dielectric material layer 96 is composed of a different interconnect dielectric material than the first interconnect dielectric material layer 16. The second interconnect dielectric material layer 96 may be formed utilizing one of the deposition processes mentioned above in forming the first interconnect dielectric material layer 16. The second interconnect dielectric material layer 96 may have a thickness ranging anywhere from 200 nm to 400 nm, although greater and lesser thicknesses can be used with the proviso that the second interconnect dielectric material layer 96 has a thickness that is greater than the total height of the top electrode/hardmask 75. A top chemical mechanical polish may then be conducted to remove excess materials and flatten the top surface of the dielectric material layer 96.

After forming the second interconnect dielectric material layer 96 and the top surface CMP, contact openings 92 can be formed at the top surface therein by lithography and etching. In an embodiment, a mask is patterned and an RIE etch conducted to form the opening(s) 92 through the dielectric layer 96 and passivation layer 90 that reach a top surface 76 of the top electrode 75. Next, a diffusion barrier material layer, can then be formed into each opening and on the topmost surface of the second interconnect dielectric material layer 96, and thereafter an electrically conductive metal 98 or metal alloy, as defined above, is deposited into each opening 92 and, is present on the diffusion barrier material layer. The electrically conductive metal 98 or metal alloy that is deposited into each opening 92 forms a top contact for the MTJ stack structure 31. A planarization process is then employed to remove the diffusion barrier material layer and the electrically conductive metal or metal alloy that is present outside of the contact openings. The remaining diffusion barrier material layer within the contact openings formed into the second interconnect dielectric material layer 96 and the remaining electrically conductive metal 98 or metal alloy within the contact openings formed into the second interconnect dielectric material layer 96 may be referred to as a second electrically conductive interconnect structure. In some embodiments, the formation of a second diffusion barrier liner may be omitted.

The resulting MRAM electrode structure shown in FIG. 10 includes a small top surface so as to avoid partial shorts during MTJ stack etching a and larger bottom surface to avoided excessive resistance increase.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a metal wiring layer contact structure having a top surface in a first interconnect dielectric material layer and located in a magnetoresistive random access memory (MRAM) device area;
   a second interconnect dielectric material layer located above said first interconnect dielectric material layer;
   a multi-layered magnetic tunnel junction (MTJ) structure disposed on said second interconnection dielectric material layer, said MTJ structure having a top ferromagnetic layer and a bottom ferromagnetic layer, the bottom ferromagnetic layer having a surface in electrical contact with said metal wiring layer contact structure; and
   a metal fill structure within said second interconnect dielectric material layer, the metal fill structure comprising an upper portion including a first end defining a first surface contact area of sub-lithographic dimension contacting the bottom ferromagnetic layer surface, and said metal fill structure comprising a lower portion surrounded by a conductive liner material, said surrounding conductive liner material having a bottom surface defining a second surface contact area contacting the top surface of said metal wiring layer contact structure, the first surface contact area being smaller than the second surface contact area.

2. The semiconductor structure as claimed in claim 1, further comprising a passivation layer formed on a top layer and sidewalls of said MTJ structure.

3. The semiconductor structure as claimed in claim 1, wherein the metal fill structure having said first end of sub-lithographic dimension of is a pillar structure.

4. The semiconductor structure as claimed in claim 3, wherein said metal fill structure is of a material selected from the group consisting of: a material selected from copper, aluminum, or tungsten, and/or alloys thereof.

5. The semiconductor structure of claim 3, further comprising: a conductive electrode having a bottom surface in electrical contact with a surface of said top ferromagnetic layer, wherein the conductive electrode is a patterned hardmask of a material selected from the group comprising: Nb, NbN, W, WN, Ta, TaN, Ti, TiN, or Al.

6. The semiconductor structure of claim 5, further comprising:
   a conductive MTJ cap layer formed between a surface of the top ferromagnetic layer of said MTJ structure and a bottom surface of a top conductive electrode, the multi-layered MTJ stack resulting from a physical etch process of said multi-layered MTJ and said metal cap layer, wherein outermost sidewalls of both the MTJ cap and the MTJ structure are vertically aligned to outermost sidewalls of said patterned hardmask.

7. The semiconductor structure as claimed in claim 1, wherein said liner material comprises a conductive material selected from the group comprising: Co, Ta, TaN, Ti, TiN, Ru, RuN, RuTa, RuTaN, W, or WN or a material stack of diffusion barrier material.

8. The semiconductor structure of claim 1, wherein said conductive liner material surrounding said lower portion of said metal fill structure is recessed to a depth below an opening of a via within which said metal fill structure and surrounding conductive liner material is formed.

9. The semiconductor structure of claim 8, wherein said conductive liner material is between ¼ to ¾ of a total depth of the via opening within which said metal fill structure and surrounding conductive liner material is formed.

\* \* \* \* \*